US008637986B2

(12) United States Patent
Masuda et al.

(10) Patent No.: US 8,637,986 B2
(45) Date of Patent: Jan. 28, 2014

(54) SEMICONDUCTOR DEVICE AND METHOD FOR MANUFACTURING THEREOF (75) Inventors: Naomi Masuda, Kanagawa (JP); Masataka Hoshino, Tokyo (JP); Ryota Fukuyama, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 42 days.

(21) Appl. No.: 12/256,333

(22) Filed: Oct. 22, 2008

(65) Prior Publication Data

US 2009/0302469 A1 Dec. 10, 2009

(30) Foreign Application Priority Data

Oct. 22, 2007 (JP) .................................. 2007-273655

(51) Int. Cl.
*H01L 23/48* (2006.01)
*H01L 23/52* (2006.01)
*H01L 29/40* (2006.01)

(52) U.S. Cl.
USPC ............. 257/739; 438/81; 438/612; 438/613; 257/738; 257/E23.023; 257/778

(58) Field of Classification Search
USPC ........... 438/612, 613; 257/738, E23.023, 778
See application file for complete search history.

(56) References Cited

U.S. PATENT DOCUMENTS

| 5,578,526 A * | 11/1996 | Akram et al. ................. 438/107 |
| 5,592,736 A * | 1/1997 | Akram et al. ................... 29/841 |
| 6,074,893 A * | 6/2000 | Nakata et al. ................. 438/106 |
| 2001/0011777 A1* | 8/2001 | Kano ............................. 257/781 |
| 2005/0173809 A1* | 8/2005 | Yamamoto et al. ........... 257/780 |
| 2006/0046468 A1* | 3/2006 | Akram et al. ................. 438/637 |

FOREIGN PATENT DOCUMENTS

| JP | 7-211722 | 8/1995 |
| JP | 8-102467 | 4/1996 |
| JP | 2006-351589 A | 12/2006 |
| JP | 2007-43010 A | 2/2007 |

* cited by examiner

*Primary Examiner* — Jarrett Stark (57) ABSTRACT

A semiconductor device which includes a first semiconductor chip 10, a first electrode 12 formed on the first semiconductor chip 10, a second semiconductor chip 20 to which the first semiconductor chip 10 is mounted, a second electrode 22 with a protrusion 24, which is formed on the second semiconductor chip 20, and a solder bump 14 which bonds the first electrode 12 and the second electrode 22 to cover at least a part of a side surface of the protrusion 24, and a method for manufacturing thereof are provided.

5 Claims, 8 Drawing Sheets

SEMICONDUCTOR DEVICE AND METHOD FOR MANUFACTURING THEREOF

CLAIM OF PRIORITY

This application claims priority from Japanese patent application 2007-273655 filed on Oct. 22, 2007

TECHNICAL FIELD

The invention relates to a semiconductor device and a method for manufacturing thereof, and more particularly, to a semiconductor device and a method for manufacturing thereof using such mounting technology as flip-chip bonding (hereinafter referred to as FCB).

BACKGROUND ART

There is currently a great demand for semiconductor devices which are both miniaturized and highly-functional. FCB mounting technology has been introduced as one solution to satisfy the demand.

Conventional techniques for FCB include forming a bonding terminal (for example, a solder bump) on the electrode of the mount portion such as a semiconductor chip, so as to mount the mount portion to a substrate (mounted portion) or another semiconductor chip, with the solder bump surface being directed downwards. The solder bump is heated to be in a molten state which covers the electrode surface on the substrate, and the alloy layer is formed from the metal used to form the electrode and the solder, thus bonding the electrodes on the first and second semiconductor chips.

The section between the metal used to form the electrode and the solder bump is required to be in the sufficiently liquid state in order to perform the bonding. Therefore, the process using a flux has been employed for maintaining the sufficient liquid state. In the aforementioned process, the electrodes of the first and the second semiconductor chips are temporarily bonded with the solder bump through thermocompression. Subsequently, an oxide film of the solder bump is eliminated using the flux to bring the section between the metal used to form the electrode and the solder bump into the liquid state so as to perform the bonding using the solder bump.

Unfortunately, the active constituent of the flux residue may cause corrosion in the alloy layer of the metal for forming the electrode and the solder, thus deteriorating the strength at the bonded portion between the electrodes. Additionally, the method requires the treatment of the cleaning solution for cleaning the flux.

Japanese Patent Application Publication No. JP-A-6-268028 proposes an alternate solution for the problem by disclosing a method for eliminating the oxide film on the electrode surface and the solder bump surface using a mixture of the gases $N_2$ and $H_2$ as a reducing gas instead of using a flux.

However, in the aforementioned method, the solder bump is heated up to the melting point of the solder or higher during the temporary bonding phase. When the solder bump temperature is maintained at a high temperature (e.g., around the solder melting point), oxidation of the solder bump is accelerated to deteriorate the liquid state of the section between the metal used to form the electrode and the solder, which may further deteriorate the strength of the bonded portion between the electrodes. The time required for heating and reductive reaction in the temporary bonding step is relatively long, thus causing an increase in cost.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to an aspect of the present invention, there is provided a semiconductor device which includes a mount portion, a first electrode formed on the mount portion, a mounted portion to which the mount portion is mounted, a second electrode having a protrusion, which is formed on the mounted portion, and a bonding terminal for bonding the first electrode and the second electrode to cover at least a part of a side surface of the protrusion. At least one of the mount portion and the mounted portion includes a semiconductor chip. This makes it possible to provide the semiconductor device capable of performing the high strength bonding of the electrodes at lower costs.

According to another aspect of the present invention, there is provided a method for manufacturing a semiconductor device which includes steps of: temporarily bonding a first electrode formed on a mount portion to a second electrode including a protrusion formed on a mounted portion by bringing a leading end of the protrusion into contact with a bonding terminal formed on the first electrode; exposing the first electrode, the second electrode and a solder contained in the bonding terminal into a reducing gas; and bonding the first electrode to the second electrode by covering at least a part of a side surface of the protrusion with the solder contained in the bonding terminal. At least one of the mount portion and the mounted portion includes a semiconductor chip. This makes it possible to provide the semiconductor device capable of performing the high strength bonding of the electrodes at lower costs.

The electrode on the mounted portion includes the protrusion, and the heating time during the temporary bonding can be shortened and the growth of the oxide film of the bonding terminal can be suppressed. The reducing gas is introduced in the state where the distance between the mount portion and the mounted portion is relatively long, and the reductive reaction proceeds efficiently in the stable state. As a result, the bonding strength may be enhanced while reducing the cost.

While the preferred embodiment of the present invention is described in details above, the present invention is not limited to the specific embodiment and, within the spirit and scope of the present invention as defined in the appended claims, various modifications and alterations may naturally be made.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the claimed subject matter, a method and system for the use of a reputation service provider, examples of which are illustrated in the accompanying drawings. While the claimed subject matter will be described in conjunction with the preferred embodiments, it will be understood that they are not intended to be limit to these embodiments. On the contrary, the claimed subject matter is intended to cover alternatives, modifications and equivalents, which may be included within the spirit and scope as defined by the appended claims.

Furthermore, in the following detailed descriptions of embodiments of the claimed subject matter, numerous specific details are set forth in order to provide a thorough understanding of the claimed subject matter. However, it will be recognized by one of ordinary skill in the art that the claimed subject matter may be practiced without these specific details. In other instances, well known methods, procedures, components, and circuits have not been described in detail as not to unnecessarily obscure aspects of the claimed subject matter.

Figure 1A:
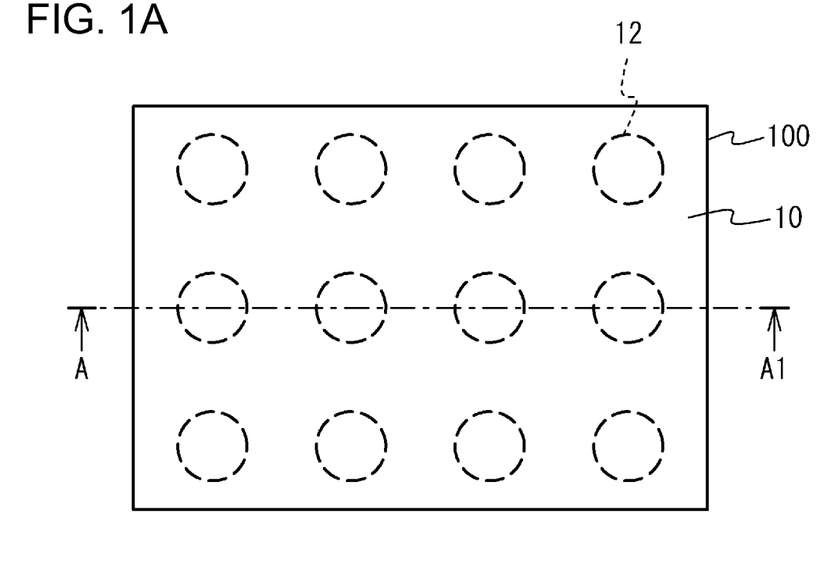
FIG. 1A is a top view of a semiconductor device according to various embodiments of the present invention.
Figure 1B:
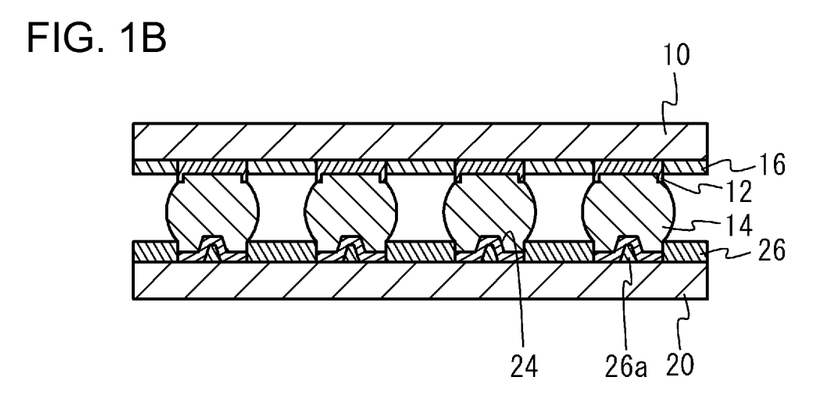
FIG. 1B is a sectional view taken along line A-A1 shown in FIG. 1A according to various embodiments of the present invention.

FIGS. 1A and 1B depict an exemplary semiconductor device having a mount portion and a mounted portion, each including a semiconductor chip formed out of silicon, and a bonding terminal that includes a solder bump. Referring to FIGS. 1A and 1B, a semiconductor device 100 according to the first embodiment will be described. FIG. 1A is a top view of the semiconductor device 100, and FIG. 1B is a sectional view taken along line A-A1 shown in FIG. 1A. FIG. 1A shows a first electrode 12 through a first semiconductor chip 10. A lower surface of the first semiconductor chip 10 is covered with an insulating layer 16 formed out of polyimide with the thickness of 5 μm. A first electrode 12 (which may be formed of such metal as Cu) is formed in an opening with the width of 40 μm formed in the insulating layer 16.

An upper surface of a second semiconductor chip 20 is covered with an insulating layer 26 formed of polyimide with the thickness of 5 μm. A second electrode 22 (which may also be formed of such metal as Cu, for example) is formed in an opening with the width of 40 μm formed in the insulating layer 26. A protrusion 24 with the width of 10 μm is formed on the center of the second electrode 22. A material layer 26a with the thermal conductivity lower than that of the metal for forming the second electrode 22 is disposed in the lower portion of the protrusion 24. Preferably, both the insulating layer 26 and the material layer 26a are produced in the same step in consideration of simplifying the manufacturing step. In other words, it is preferable to use the same material for forming both the insulating layer 26 and the material layer 26a. The first electrode 12 and the second electrode 22 are then bonded through a solder bump 14. The first and the second electrodes 12 and 22 may be formed into any shape, according to various embodiments. However, it may be preferable that those electrodes have circular planar shapes when seen from above, because the solder bump 14 may become spherical under the surface tension when brought into a molten state.

Figure 2A:
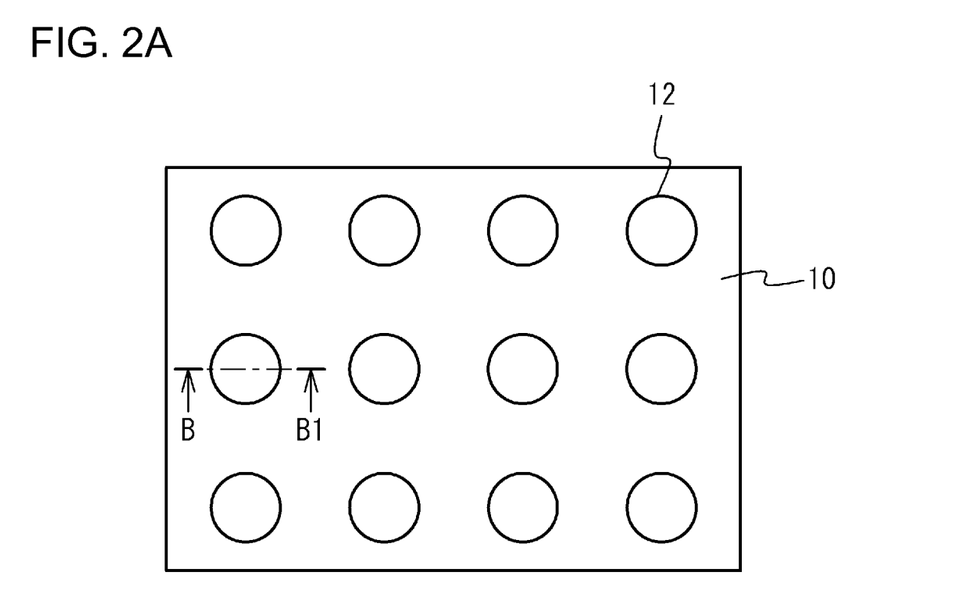
FIG. 2A is a bottom view of a semiconductor chip according to various embodiments of the present invention.
Figure 2B:
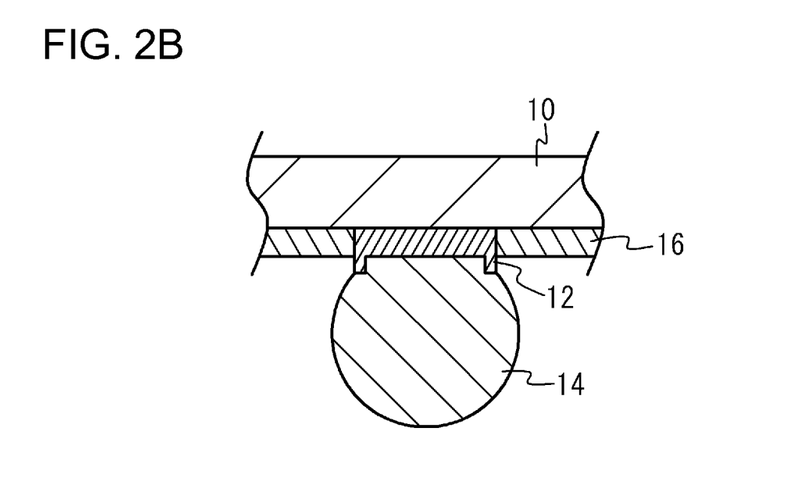
FIG. 2B is a sectional view taken along line B-B1 shown in FIG. 2A according to various embodiments of the present invention.
Figure 3A:
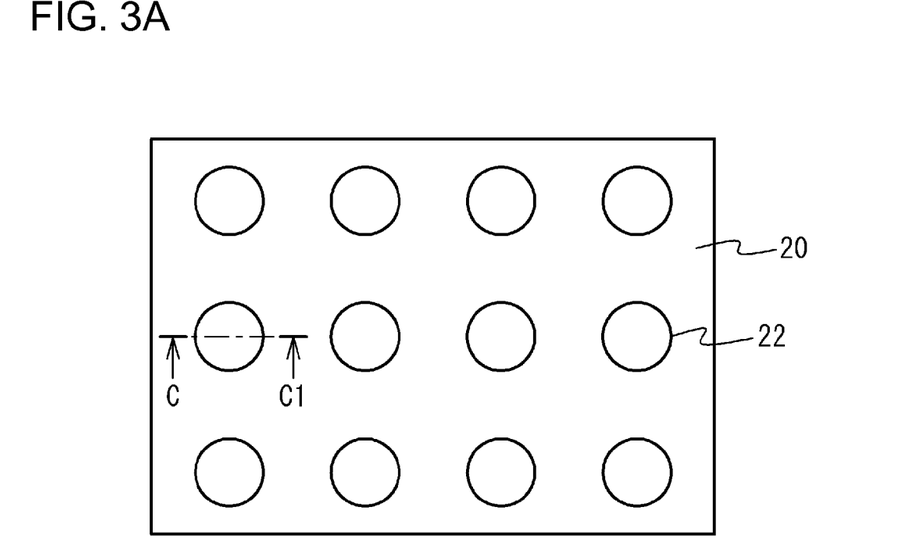
FIG. 3A is a top view of a second semiconductor chip according to various embodiments of the present invention.
Figure 3B:
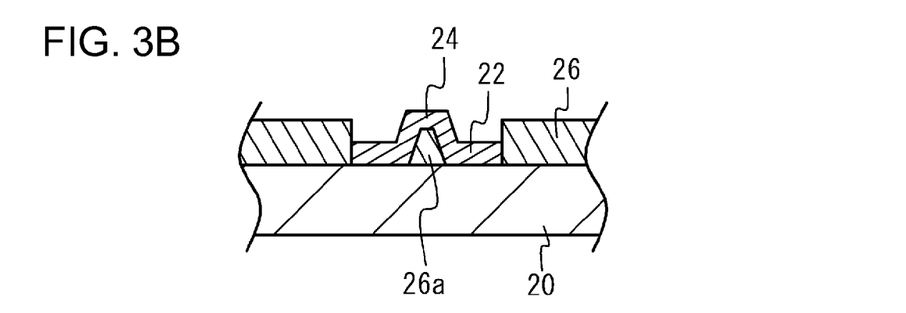
FIG. 3B is a sectional view taken along line C-C1 shown in FIG. 3A according to various embodiments of the present invention.

FIGS. 2A to 4C describe a method for manufacturing the semiconductor device 100 according to various embodiments. FIG. 2A is a bottom view of the first semiconductor chip 10, and FIG. 2B is a sectional view taken along line B-B1 shown in FIG. 2A. Referring to FIG. 2B, the solder bump 14 is formed at the lower portion of the first electrode 12. FIG. 3A is a top view of the semiconductor chip 20, and FIG. 3B is a sectional view taken along line C-C1 shown in FIG. 3A. Referring to FIG. 3B, the second electrode 22 is not provided with the solder bump.

Figure 4A:
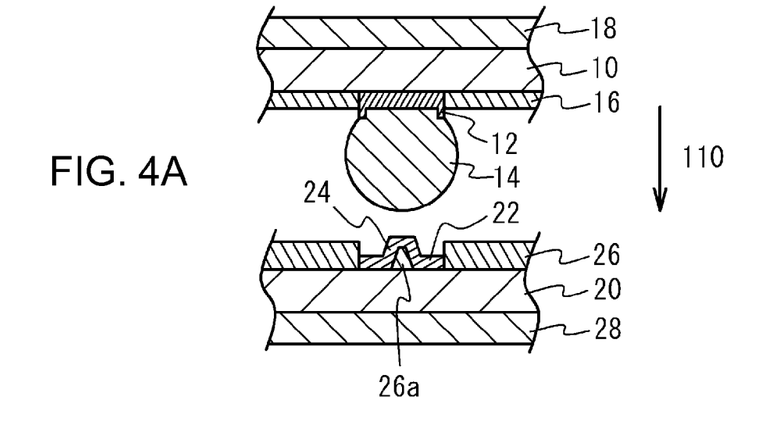
FIG. 4A is a sectional view illustrating an adsorption of a semiconductor chip in a method for manufacturing the semiconductor device according to various embodiments of the present invention.
Figure 4B:
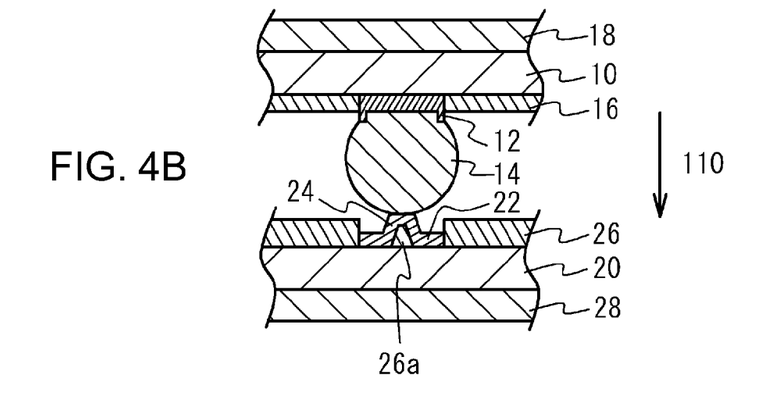
FIG. 4B is a sectional view of bringing a solder bump into contact with a protrusion in a method for manufacturing a semiconductor device according to various embodiments of the present invention.
Figure 4C:
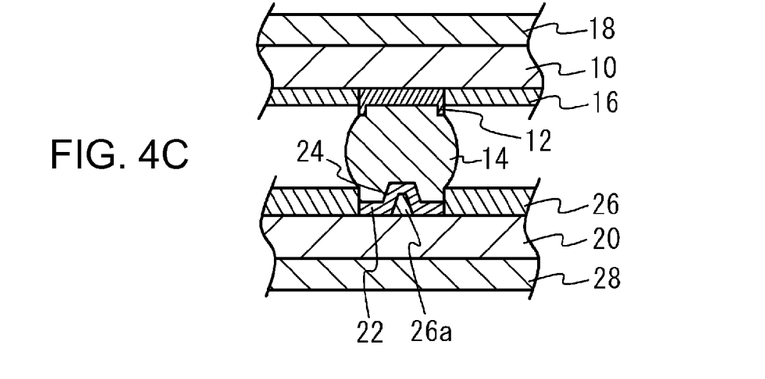
FIG. 4C is a sectional view of a liquid state between a solder bump and a second electrode in a method for manufacturing a semiconductor device according to various embodiments of the present invention.

FIGS. 4A to 4C depict the process of mounting the first semiconductor chip 10 to the second semiconductor chip 20 through FCB. Referring to FIGS. 4A and 4B, the step of temporarily bonding the first and the second electrodes 12 and 22 through the solder bump 14 will be described. Referring to FIG. 4A, the first semiconductor chip 10 is adsorbed at a tool 18 of a flip-chip bonder, and the second semiconductor chip 22 is fixed onto a stage 28 of the flip-chip bonder. The tool 18 may, for example, contain a heater therein. The first and the second electrodes 12 and 22 are subsequently positioned to face each other, and the first semiconductor chip 10 is moved in the direction of an arrow 110.

Referring to FIG. 4B, the solder bump 14 is brought into contact with the leading end of the protrusion 24 formed on the second electrode 22 so as to be heated using the heater built in the tool 18 on the first semiconductor chip 10. The heat generated by the tool 18 is transferred to the protrusion 24 through the solder bump 14. At this time, the heat may not be not easily transferred from the leading end of the protrusion 24 to the other portion of the second electrode 22 because the material layer 26a with the low thermal conductivity is provided in the lower portion of the protrusion 24. As a result, the leading end of the protrusion 24 may be selectively heated to the temperature equal to or higher than the melting point of the solder. The solder bump 14 and the leading end of the protrusion 24 form the alloy layer of the metal used to form the second electrode 22 and the solder such that the first and the second electrodes 12 and 22 are temporarily bonded. The first and the second electrodes 12 and 22 in the temporarily bonded state are electrically monitored, and the operation of the first semiconductor chip 10 is electrically monitored. When the device is determined to be unacceptable, the first semiconductor chip 10 is replaced. When the device is determined to be acceptable, the process proceeds to the subsequent step.

After the temporary bonding, the reducing gas, (a mixture of the gases $N_2$ and $H_2$, for example), and the formic acid is introduced into the section between the first semiconductor chip 10 and the second semiconductor chip 20. This causes a reductive reaction so as to eliminate the oxide film on the surface of the solder bump 14.

Referring to FIGS. 4B and 4C, bonding the first and the second electrodes 12 and 22 will be described. After the reductive reaction, the first semiconductor chip 10 is moved in the direction of the arrow 110. As the oxide film on the surface of the solder bump 14 has been eliminated, the section between the solder bump 14 and the second electrode 22 is in a sufficiently liquid state so that the solder bump 14 spreads from the leading end of the protrusion 24 to the side surfaces of the protrusion 24, and further to the bottom surface of the second electrode 22. The alloy layer may be formed of the metal used to form the second electrode 22 and the solder to bond the first and the second electrodes 12 and 22. The bonding is established by partially covering the side surface of the protrusion 24 with the solder bump 14. However, it is preferable to cover the entire side surface of the protrusion 24 in consideration with the bonding strength. In order to enhance the bonding strength, it is preferable that the solder bump 14 covers the entire surface of the second electrode 22.

In one embodiment, as the material layer 26a with the low thermal conductivity is disposed in the lower portion of the protrusion 24, the heat transferred from the solder bump 14 is not easily transferred to the second semiconductor chip 20 from the leading end of the protrusion 24. The width of the protrusion 24 is 10 μm, which is smaller than that of the second electrode 22, that is, 40 μm. This makes it possible to reduce the time taken for heating during the temporary bonding, thus suppressing the growth of the oxide film on the solder bump 14. Therefore, the section between the metal for forming the second electrode 22 and the solder may be brought into the sufficiently liquid state and thus the bonding strength between the first and the second electrodes 12 and 22 is enhanced.

FIG. 4B illustrates the temporarily bonded state. In FIG. 4B, the distance between the first and the second semiconductor chips 10 and 20 is 40 μm, which is larger than the distance when the electrode includes the protrusion 24. Furthermore, the area of the exposed portions of the solder bump 14 and the second electrode 22 is large. Therefore, the reducing gas sufficiently diffuses to the surfaces of the solder bump 14 and the second electrode 22 to allow the efficient reductive reaction in the stable state. As a result, the time required for the reductive reaction is reduced, and the strength at the bonding of the first and the second electrodes 12 and 22 is enhanced.

In this embodiment, the time for heating and the time required for the reductive reaction in the temporary bonding step may be reduced. So the time for performing the FCB mount may be reduced to be shorter than, for example, $1/10$ of the time required when the electrode has no protrusion. Accordingly, the occupancy time for the flip-chip bonder per semiconductor device (package) may be reduced, which in turn may reduce the cost for manufacturing the semiconductor device to $1/10$. Furthermore, in the temporarily bonded state, the leading end of the protrusion 24 is merely in contact with the solder bump 14. Therefore, the first semiconductor chip 10 may be easily removed when an unacceptable device is detected.

Referring to FIG. 4C, in the bonding step, a sufficiently liquid state between the solder bump 14 and the second electrode 22 allows the solder bump 14 to spread over the surface of the second electrode 22 under the surface tension. At this time, as the solder bump 14 pushes air outward of the second electrode 22 from the leading end of the protrusion 24, formation of the entrainment void inside the solder bump 14 may be suppressed. This makes it possible to increase the area of bonded portion between the first and the second electrodes 12 and 22, and to enhance the mechanical bonding strength.

An alternate embodiment includes an example where the protrusion is formed on the end of the second electrode. A method for manufacturing a semiconductor device according to the alternate embodiment will be described referring to FIGS. 5A to 6C. As the first semiconductor chip 10 is the same as the one described in the first embodiment, the explanation thereof will be omitted.

Figure 5A:
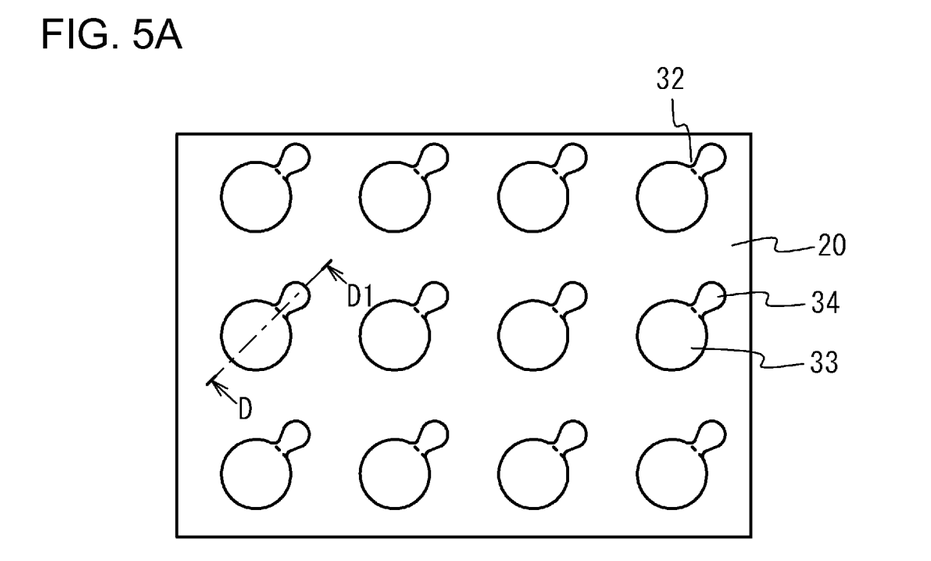
FIG. 5A is a top view of a second semiconductor chip according to various embodiments of the present invention.
Figure 5B:
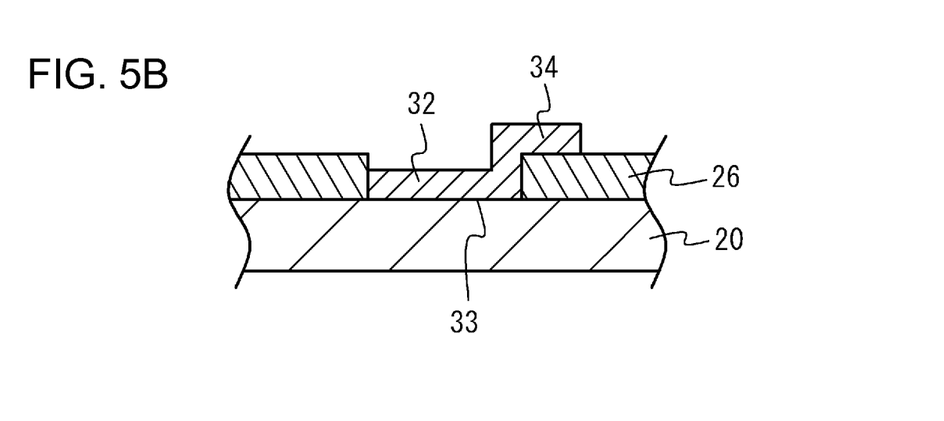
FIG. 5B is a sectional view taken along line D-D1 shown in FIG. 5A according to various embodiments of the present invention.

FIG. 5A is a top view of the second semiconductor chip 20 according to the alternate embodiment, and FIG. 5B is a sectional view taken along line D-D1 shown in FIG. 5A. A protrusion 34 is formed on the upper surface of the insulating layer 26 adjacent to an opening 33 having the second electrode 32 exposed. The insulating layer 26 may be formed of, for example, polyimide with a thermal conductivity lower than that of the metal for forming the second electrode. Referring to FIG. 5A, each of the plurality of second electrodes 32 formed on the second semiconductor chip 20 may have the same relative positional relationship between the opening 33 and the protrusion 34.

Figure 6A:
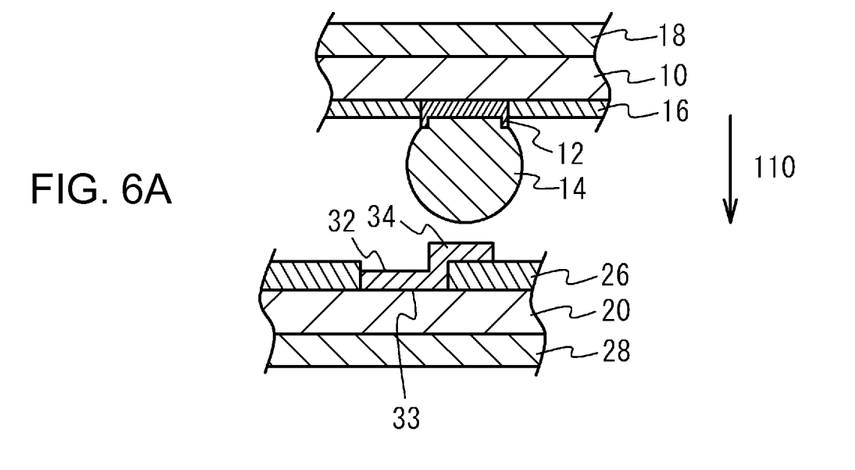
FIG. 6A is a sectional view illustrating the positioning of a solder bump and a protrusion in a method for manufacturing the semiconductor device according to various embodiments of the present invention.
Figure 6B:
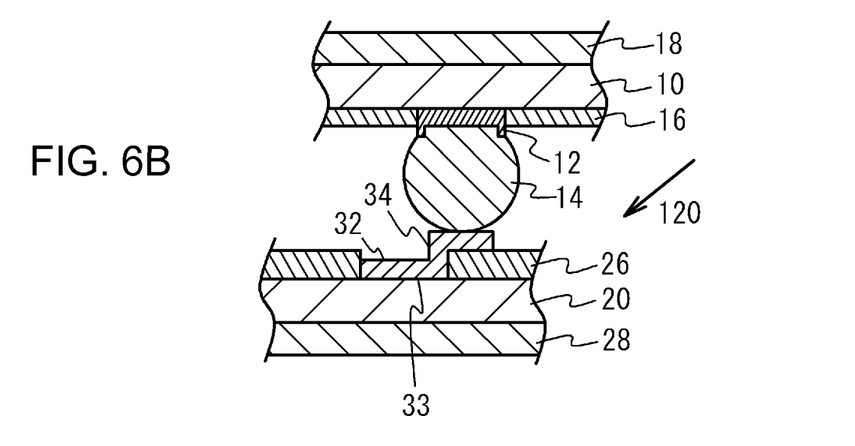
FIG. 6B is a sectional view illustrating the positioning of a first semiconductor chip in a method for manufacturing the semiconductor device according to various embodiments of the present invention.
Figure 6C:
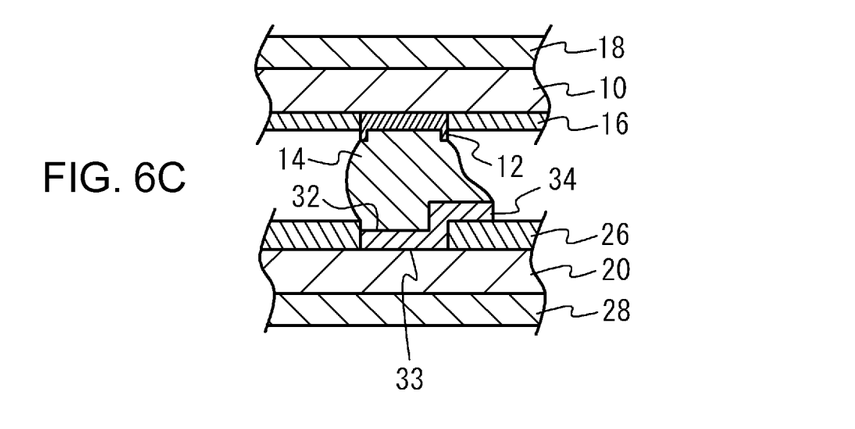
FIG. 6C is a sectional view illustrating the spreading of a solder bump on a protrusion in a method for manufacturing the semiconductor device according to various embodiments of the present invention.

FIGS. 6A to 6C depict the process for mounting the first semiconductor chip 10 to the second semiconductor chip 20 through FCB. Referring to FIGS. 6A and 6B, the process for temporarily bonding the first and the second electrodes 12 and 32 through the solder bump 14 will be described. As FIG. 6A shows, the solder bump 14 and the protrusion 34 are positioned to face each other, and the first semiconductor chip 10 is moved in the direction of the arrow 110. As FIG. 6B shows, the solder bump 14 is brought into contact with the leading end of the protrusion 34 formed on the second electrode 32 so as to be heated with the heater built in the tool 18 on the first semiconductor chip 10. The heat generated by the tool 18 is transferred to the protrusion 34 through the solder bump 14. Typically, at this time, as the thermal conductivity of the insulating layer 26 below the protrusion 34 is low, the heat may not be easily transferred from the leading end of the protrusion 34 to the other portion of the second electrode 32.

As a result, the leading end of the protrusion 34 may be selectively heated to the temperature equal to or higher than the solder melting point. The solder bump 14 and the leading end of the protrusion 34 form the alloy layer of the metal used to form the second electrode 32 and the solder, thus temporarily bonding the first and the second electrodes 12 and 32. In the temporarily bonded state, the bonded state of the first and the second electrodes 12 and 32 is electrically monitored, and the operation of the first semiconductor chip 10 is electrically monitored. If the device is unacceptable, the first semiconductor chip 10 can be replaced. If the device is acceptable, the process can proceed to the subsequent step. After the temporary bonding step, the reducing gas is introduced into the section between the first semiconductor chip 10 and the second semiconductor chip 20 to cause the reductive reaction, thus eliminating the oxide film on the surface of the solder bump 14.

Referring to FIGS. 6B and 6C, a process for bonding the first and the second electrodes 12 and 32 according to various embodiments will be described. After the reductive reaction, the first semiconductor chip 10 is moved in the direction of an arrow 120 shown in FIG. 6B such that the first and the second electrodes 12 and 32 face each other. As the oxide film on the surface of the solder bump 14 has been eliminated, the section between the solder bump 14 and the second electrode 32 is in the sufficiently liquid state. Referring to FIG. 6C, the solder bump 14 spreads from the leading end of the protrusion 34 to the side surface thereof, and further to the bottom surface of the second electrode 32. The metal for forming the second electrode 32 and the solder form the alloy layer so as to bond the first and the second electrodes 12 and 32. At this time, the bonding is established by partially covering the side surface of the protrusion 34 with the solder bump 14. However, it may be preferable to cover the entire side surface of the protrusion 34 at the side of the opening 33. It is more preferable that the solder bump 14 covers the entire surface of the second electrode 32 so as to further enhance the bonding strength.

In an alternate embodiment, the section between the solder bump 14 and the second electrode 32 may be in a sufficiently liquid state. Therefore, the solder bump 14 spreads along the surface of the second electrode 32 under the surface tension in the bonding step. At this time, the solder bump 14 pushes air from one end of the second electrode 32 to the other end. As a result, the effect for suppressing formation of the entrainment void inside the solder bump 14 may further be improved compared with the first described embodiment, thus enhancing the mechanical bonding strength.

In this embodiment, the first semiconductor chip 10 is moved to position the first and the second electrodes 12 and 32 to face each other in the bonding step. In the structure, the second semiconductor chip 20 may be moved.

A third alternative embodiment shows an example where the bonding terminal is formed of the metal post as the metal (such as Cu, for example and the solder layer formed on the surface of the metal post opposite the second electrode. Referring to FIGS. 7A to 8D, the method for manufacturing the semiconductor device according to a still further embodiment will be described. As the second semiconductor chip 20 is the same as the second semiconductor chip 20 described in the first embodiment, an explanation thereof will be omitted.

Figure 7A:
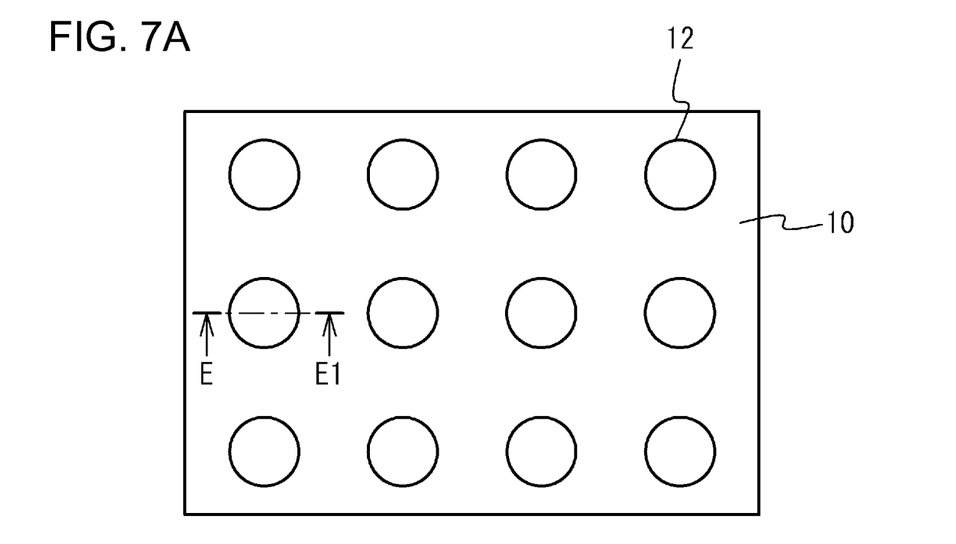
FIG. 7A is a bottom view of a first semiconductor chip according to various embodiments of the present invention.
Figure 7B:
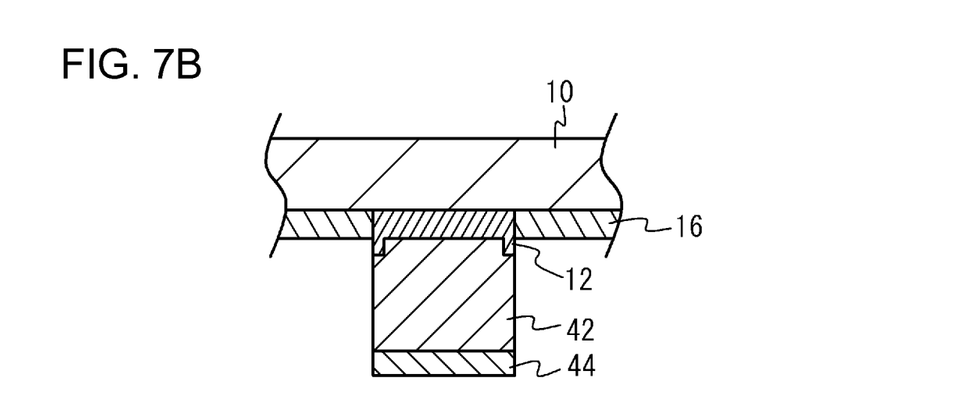
FIG. 7B is a sectional view taken along line E-E1 shown in FIG. 7A according to various embodiments of the present invention.

FIG. 7A is a bottom view of the first semiconductor chip 10, and FIG. 7B is a sectional view taken along line E-E1 shown in FIG. 7A. A metal post 42 is formed at a lower portion of the first electrode 12, having the lower surface coated with a solder layer 44.

Figure 8A:
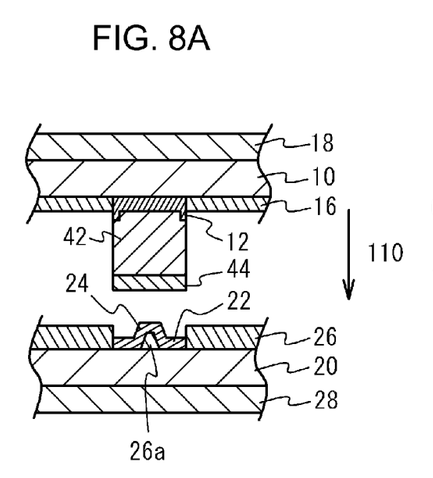
FIG. 8A is a sectional view illustrating the positioning of a first and second electrode in a method for manufacturing the semiconductor device according to various embodiments of the present invention.
Figure 8B:
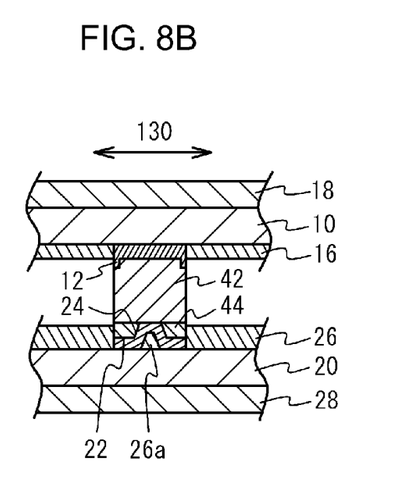
FIG. 8B is a sectional view illustrating the positioning of a solder layer with respect to a protrusion in a method for manufacturing the semiconductor device according to various embodiments of the present invention.
Figure 8C:
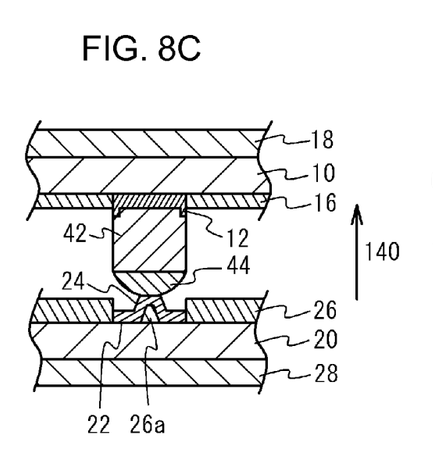
FIG. 8C is a sectional view illustrating stopping an ultrasonic oscillation in a method for manufacturing the semiconductor device according to various embodiments of the present invention.

FIGS. 8A to 8D depict the process for mounting the first semiconductor chip 10 to the second semiconductor chip 20 through FCB. As FIGS. 8A to 8C show, the first and the second electrodes 12 and 22 are temporarily bonded through the metal post 42 and the solder layer 44. Referring to FIG. 8A, the first and the second electrodes 12 and 22 are positioned to face each other, and the first semiconductor chip 10 is moved toward the direction of the arrow 110. Referring to FIG. 8B, the surface of the solder layer 44 is brought into contact with the leading end of the protrusion 24 formed on the second electrode 22 so as to be heated by the heater built in the tool 18 disposed on the first semiconductor chip 10. The heat generated by the tool 18 is transferred to the protrusion 24 through the solder layer 44. Simultaneously, the ultrasonic oscillation in the direction of an arrow 130 is applied to the first semiconductor chip 10 so as to cause friction between the metal post 42 and the leading end of the protrusion 24, thus eliminating the oxide film thereon.

Referring to FIG. 8C, the ultrasonic oscillation is stopped, and the first semiconductor chip 10 is lifted toward the direction of an arrow 140 so as to separate the first semiconductor chip 10 from the second semiconductor chip 20 until the solder layer 44 is in contact with the leading end of the protrusion 24. The oxide film on the leading end of the protrusion 24 is eliminated and thus the section between the metal surface and the solder layer 44 is in a sufficiently liquid state. As a result, the solder layer 44 spreads over the leading end of the protrusion 24 in the liquid state, and the alloy layer of the metal for forming the second electrode 22 and the solder is formed at the leading end of the protrusion 24. Meanwhile, the oxide film on the other portion of the second electrode 22 has not been eliminated, thus failing to realize the sufficiently liquid state between the metal surface and the solder layer 44. Accordingly, the alloy layer of the metal for forming the second electrode 22 and the solder is not formed. As a result, the alloy layer of the metal for forming the second electrode 22 and the solder is formed only at the leading end of the protrusion 24, thus temporarily bonding the first and the second electrodes 12 and 22. In the temporarily bonded state, the bonded state of the first and the second electrodes 12 and 22 is electrically verified, and the operation of the first semiconductor chip 10 is electrically verified. If the device is unacceptable, the first semiconductor chip 10 can be replaced. If the device is acceptable, the process may then proceed to a subsequent step.

Figure 8D:
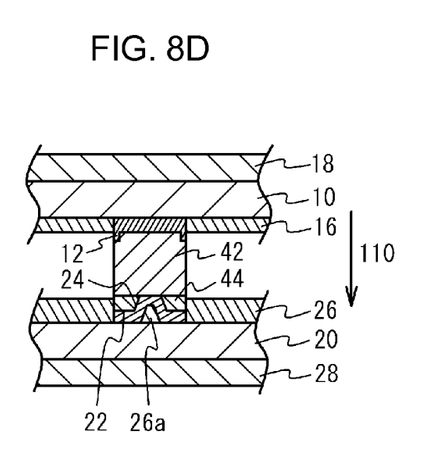
FIG. 8D is a sectional view illustrating the bonding of a first and second electrode in a method for manufacturing the semiconductor device according to various embodiments of the present invention.

After the temporary bonding, the reducing gas is introduced into the section between the first and the second semiconductor chips 10 and 20 to cause the reductive reaction, thus eliminating the oxide films on the surfaces of the second electrode 22 and the solder layer 44. Referring to FIG. 8D, bonding the first and the second electrodes 12 and 22 will be described. The first semiconductor chip 10 is moved in the direction of the arrow 110. Because the oxide film on the surfaces of the second electrode 22 and the solder layer 44 has been eliminated, the sufficiently liquid state may be obtained. The solder layer 44 spreads from the leading end of the protrusion 24 to the side surfaces thereof and further to the bottom surface of the second electrode 22. The alloy layer of the metal for forming the second electrode 22 and the solder is formed such that the first and the second electrodes 12 and 22 are bonded. At this time, the bonding is established by partially covering the side surface of the protrusion 24 with the solder layer 44. However, it is preferable to cover the entire side surface of the protrusion 24 in consideration with the bonding strength. It is more preferable that the solder layer 44 covers the entire surface of the second electrode 22 for further enhancing the bonding strength.

In this embodiment, the leading end of the protrusion 24 is rubbed with the metal post 42—as shown in FIG. 8B—to eliminate the oxide film. As the protrusion 24 is smaller than the second electrode 22, the oxide film may be efficiently eliminated relative to the case where the entire second electrode 22 is rubbed, thus reducing the processing time. As the bonding terminal is formed of the metal post 42 and the plated solder layer 44 at the lower surface, the amount of the solder used may be decreased compared to when the bonding terminal is formed only of the solder bump.

In this embodiment, the material layer 26a may be disposed in the lower portion of the protrusion 24. However, the material layer 26a does not have to be provided. In this embodiment, the heating is performed from the upper portion of the first semiconductor chip 10. However, the heating may be performed from the lower portion of the second semiconductor chip 20. This embodiment illustrates an example where the ultrasonic oscillation is applied to the first semiconductor chip 10. However, the ultrasonic oscillation may be applied to the second semiconductor chip 20, or to both the first and the second semiconductor chips 10 and 20.

The above described embodiments depict the exemplary cases where both the mount portion and the mounted portion are formed as the semiconductor chips. However, they may be formed as the insulating substrates such as interconnection substrates with the semiconductor chips mounted thereon instead of the use of the semiconductor chip. Either one of those portions may be the substrate with no semiconductor chip mounted. In other words, at least one of the mount portion and the mounted portion may include the semiconductor chip.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A semiconductor device comprising:
   a semiconductor chip;
   a first electrode formed on the semiconductor chip;
   a first material layer to which the semiconductor chip is mounted;
   a second material layer;
   a second semiconductor chip;
   a second electrode formed on the second semiconductor chip having a protrusion formed therein wherein the second electrode and material formed inside of the protrusion to have slanted side surfaces have coplanar bottom surfaces, wherein a bottom surface of said material and a top surface of said material are parallel and said top surface is shorter in length than said bottom surface and wherein the protrusion of the second electrode is centered halfway between a pair of protrusions of the first electrode that extend in the direction toward the second electrode; and
   a bonding terminal for bonding the first electrode and the second electrode.

2. The semiconductor device according to claim 1, wherein the first electrode and second electrode are bonded to cover at least part of a side surface of the protrusion.

3. The semiconductor device according to claim 1, wherein the bonding terminal is formed from a solder.

4. The semiconductor device according to claim 1, wherein:
   the bonding terminal is formed from a metal post and a solder layer; and
   the solder layer is formed on a surface of the metal post opposite to the second electrode.

5. The semiconductor device according to claim 1, wherein:
   the semiconductor chip includes a material layer;
   the material layer is disposed at a lower portion of the protrusion; and
   the material layer has a thermal conductivity lower than that of a surface of the second electrode.

* * * * *